(12) United States Patent
Yang et al.

(10) Patent No.: US 11,527,644 B2
(45) Date of Patent: Dec. 13, 2022

(54) SWITCHING LDMOS DEVICE AND METHOD FOR MAKING THE SAME

(71) Applicant: SHANGHAI HUAHONG GRACE SEMICONDUCTOR MANUFACTURING CORPORATION, Shanghai (CN)

(72) Inventors: Xinjie Yang, Shanghai (CN); Feng Jin, Shanghai (CN); Wei Le, Shanghai (CN); Han Zhang, Shanghai (CN); Liang Song, Shanghai (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 0 days.

(21) Appl. No.: 17/184,664

(22) Filed: Feb. 25, 2021

(65) Prior Publication Data

US 2021/0336054 A1 Oct. 28, 2021

(30) Foreign Application Priority Data

Apr. 22, 2020 (CN) .......................... 202010321166.9

(51) Int. Cl.
*H01L 29/78* (2006.01)
*H01L 29/06* (2006.01)
*H01L 29/66* (2006.01)

(52) U.S. Cl.
CPC ...... *H01L 29/7816* (2013.01); *H01L 29/0653* (2013.01); *H01L 29/66484* (2013.01);
(Continued)

(58) Field of Classification Search
CPC ............. H01L 29/7816; H01L 29/0653; H01L 29/66484; H01L 29/66492; H01L 29/66689; H01L 29/7831; H01L 29/7835; H01L 29/1045; H01L 29/1087; H01L 29/66659; H01L 29/0619; H01L 29/086; H01L 29/0878; H01L 29/66681; H01L 29/66674–66734; H01L 29/7801–7826; H01L 29/0856–0869; H01L 29/0873–0886
See application file for complete search history.

(56) References Cited

U.S. PATENT DOCUMENTS

2014/0225192 A1* 8/2014 Lee ..................... H01L 29/7816
438/286
2017/0018612 A1* 1/2017 Ito ....................... H01L 29/1045
(Continued)

*Primary Examiner* — Shahed Ahmed
(74) *Attorney, Agent, or Firm* — Dilworth IP, LLC

(57) ABSTRACT

A switching LDMOS device is formed first well in a semiconductor substrate that includes an LDD region and a first body doped region; a first heavily doped region serving as a source region is provided in the LDD region, and a second heavily doped region serving as a drain region is provided in the first body doped region; a channel of the switching LDMOS device is formed at a surface layer of the semiconductor substrate between the LDD region and the body doped region and below the gate structure; and one side of the LDD region and one side of the body doped region which are away from the gate structure both are provided with a field oxide or STI, and one side of the field oxide or STI is in contact with the first heavily doped region or the second heavily doped region.

9 Claims, 8 Drawing Sheets

(52) U.S. Cl.
CPC .. *H01L 29/66492* (2013.01); *H01L 29/66689* (2013.01); *H01L 29/7831* (2013.01); *H01L 29/7835* (2013.01)

(56) References Cited

U.S. PATENT DOCUMENTS

| | | | |
|---|---|---|---|
| 2017/0125584 A1* | 5/2017 | Zhang | H01L 29/063 |
| 2019/0131402 A1* | 5/2019 | Liu | H01L 29/42356 |
| 2020/0343380 A1* | 10/2020 | Takeuchi | H01L 29/086 |
| 2021/0013340 A1* | 1/2021 | Reghunathan | H01L 29/086 |
| 2021/0118987 A1* | 4/2021 | Yao | H01L 29/0847 |

\* cited by examiner

SWITCHING LDMOS DEVICE AND METHOD FOR MAKING THE SAME

CROSS REFERENCE TO RELATED APPLICATION

The present application claims priority to Chinese Patent Application No. 202010321166.9 filed on Apr. 22, 2020, the entirety of which is incorporated by reference herein.

TECHNICAL FIELD

The present disclosure relates to the field of designing and manufacturing semiconductor devices, in particular to a method for manufacturing a switching LDMOS device.

BACKGROUND OF THE INVENTION

Currently, the 5V switching LDMOS device employs the conventional structure of the CMOS. Referring to FIG. 1, taking the most common N type LDMOS device structure as an example, FIG. 1 shows only some key structures, and there are LDD regions in the P well. The source region and drain region of the switching LDMOS device are respectively located in the LDD regions, there is a channel region between the two LDD regions, the substrate surface between the two LDD regions is provided with a gate structure of the switching LDMOS device consisting of a gate oxide layer and a polysilicon gate, and gate sidewalls are further provided at both sides of the gate structure along the channel length direction.

The substrate surface is further provided with a field oxide (or STI). The field oxide isolates the heavily doped P type region from the LDD region, and the heavily doped P type region serves as a leading-out region to lead out the P well.

The general breakdown voltage BV of the 5V NMOS is 11.5 V, the channel length Lch is 0.6 um, and the square resistance Rsp is 2 $M\Omega/mm^2$, while the general breakdown voltage BV of the 5V PMOS is 10.5 V, the channel length Lch is 0.5 um, and the square resistance Rsp is 7 $M\Omega/mm^2$.

The current conventional manufacturing process of 5V MOS devices is as follows:

First, an active region is planned on a semiconductor substrate such as a silicon substrate, then a well region is formed in the active region (regarding the PMOS, an N well is formed in the active region, and regarding the NMOS, a P well is formed in the active region), an oxide layer is formed as a gate dielectric layer by means of the thermal oxidation method on the substrate surface, then a layer of polysilicon is deposited, a gate structure is formed by means of etching, an LDD region is formed in the active region by means of ion implantation (regarding the PMOS, an N type LDD is formed, and regarding the NMOS, a P type LDD is formed), and then gate sidewalls are formed at both sides of the gate structure by depositing oxide or nitride and by performing etching; and a heavily doped N type region and a heavily doped P type region are formed by means of self-aligned implantation. Regarding the NMOS, the heavily doped N type region serves as the source region and drain region of the LDMOS device, and the heavily doped P type region serves as the leading-out region of the well region.

The technical problems of the current CMOS process primarily lie in:

1. the BV cannot be high (≥15 V), being incapable of satisfying the new application scenarios;

2. the Rsp cannot continue to be reduced at high ratio, making it difficult to reduce the chip area.

The reasons for the above problems are:

1. Since the formation process of the LDD region is a process of implantation through polysilicon, in order to prevent ion implantation from penetrating through the polysilicon, the ion implantation energy of the LDD cannot be very high, in which case the junction formed has a relatively small depth, which cannot satisfy the requirements of the high BV.

2. The formation process of the well region is shared by other basic devices, and the surface concentration of the well region cannot reach a relatively high value, in which case a large channel length Lch is required to ensure the breakdown voltage BV, thereby limiting miniaturization of the device size.

SUMMARY OF THE INVENTION

The technical problem to be solved by the present disclosure is to provide a switching LDMOS device, to improve the problems that a breakdown voltage is difficult to increase and the device size is excessively large.

Another technical problem to be solved by the present disclosure is to provide a method for manufacturing the switching LDMOS device.

In order to solve the above-mentioned problems, the switching LDMOS device of the present disclosure is formed in a first well of a first conductivity type in a semiconductor substrate, wherein the first well comprises an LDD region of the switching LDMOS device and a first body doped region of a second conductivity type; a gate structure of the switching LDMOS device is formed on the surface of the substrate between the LDD region and the body doped region of the second conductivity type;

the gate structure comprises a gate dielectric layer covering the substrate surface and a polysilicon gate covering the gate dielectric layer; gate sidewalls are further provided at both sides of the gate structure;

a first heavily doped region of the second conductivity type is provided in the LDD region, one side of the first heavily doped region is in contact with the edge of the gate sidewall, and the first heavily doped region serves as a source region of the switching LDMOS device;

a second heavily doped region of the second conductivity type is provided in the first body doped region, one side of the second heavily doped region is in contact with the edge of the gate sidewall, and the second heavily doped region serves as a drain region of the switching LDMOS device;

a channel of the switching LDMOS device is formed in a surface layer of the semiconductor substrate between the LDD region and the body doped region and below the gate structure, and when a voltage applied to the gate exceeds a threshold voltage of the LDMOS device, the channel is inverted to achieve conduction between the source region and the drain region; and one side of the LDD region and one side of the body doped region which are away from the gate structure both are provided with a field oxide or STI, and one side of the field oxide or STI is in contact with the first heavily doped region in the LDD region or the second heavily doped region in the first body doped region.

In an embodiment, in the first well, a third heavily doped region of the first conductivity type is further provided at an outer side which away from the gate structure of the field oxide or STI close to the first body doped region, and the third heavily doped region forms a leading-out region to lead the first well out of an electrode.

In an embodiment, a second gate structure is further provided on the field oxide or STI, the second gate structure and the gate structure of the switching LDMOS device are synchronously formed by means of etching, the second gate structure is used as a mask for self-aligned implantation of the first heavily doped region and the second heavily doped region, or, the second gate structure is used as a mask for self-aligned implantation of the first heavily doped region or the second heavily doped region, and after the self-aligned implantation is completed, the second gate structure can be selectively removed or retained.

In an embodiment, the first body doped region of the second conductivity type is formed by means of self-aligned implantation.

In an embodiment, the first conductivity type is a P type and the second conductivity type is an N type; or the first conductivity type is an N type and the second conductivity type is a P type.

A switching LDMOS device is formed in a first well of a first conductivity type in a semiconductor substrate, wherein:

the first well comprises a first body doped region of a second conductivity type and a second body doped region of a first conductivity type; a gate structure of the switching LDMOS device is formed on the surface of the substrate between the first body doped region and the second body doped region;

the gate structure comprises a gate dielectric layer covering the substrate surface and a polysilicon gate covering the gate dielectric layer; gate sidewalls are further provided at both sides of the gate structure;

a first heavily doped region of the second conductivity type is provided in the second body doped region, one side of the first heavily doped region is in contact with the edge of the gate sidewall, and the first heavily doped region serves as a source region of the switching LDMOS device;

a second heavily doped region of the second conductivity type is provided in the first body doped region, one side of the second heavily doped region is in contact with the edge of the gate sidewall, and the second heavily doped region serves as a drain region of the switching LDMOS device;

a channel of the switching LDMOS device is formed in a surface layer of the semiconductor substrate between the second body doped region and the first body doped region and below the gate structure, and when a voltage applied to the gate exceeds a threshold voltage of the LDMOS device, the channel is inverted to achieve conduction between the source region and the drain region; and one side of the second body doped region and one side of the first body doped region which are away from the gate structure both are provided with a field oxide or STI, and one side of the field oxide or STI is in contact with the first heavily doped region in the second body doped region or the second heavily doped region in the first body doped region.

In an embodiment, in the first well, a third heavily doped region of the first conductivity type is further provided at an outer side which away from the gate structure of the field oxide or STI close to the first body doped region and the third heavily doped region forms a leading-out region to lead the first well out of an electrode.

In an embodiment, a second gate structure is further provided on the field oxide or STI, the second gate structure and the gate structure of the switching LDMOS device are synchronously formed by means of etching, the second gate structure is used as a mask for self-aligned implantation of the first heavily doped region and the second heavily doped region, or, the second gate structure is used as a mask for self-aligned implantation of the first heavily doped region or the second heavily doped region, and after the self-aligned implantation is completed, the second gate structure can be selectively removed or retained.

In an embodiment, the first body doped region and the second body doped region are formed by means of self-aligned implantation.

A method for manufacturing a switching LDMOS device comprises the following process steps:

Step 1: providing a semiconductor substrate, wherein an active region is formed on the semiconductor substrate, the active region being used to form the switching LDMOS device; performing ion implantation in the active region to produce a well region of the switching LDMOS device; and depositing an oxide layer on the surface of the semiconductor substrate, and then depositing a polysilicon layer on the oxide layer;

Step 2: etching the polysilicon layer and the oxide layer by means of photoresist definition, to form a gate structure of the switching LDMOS device, wherein the oxide layer serves as a gate dielectric layer, and the polysilicon layer is etching-molded to form a polysilicon gate of the switching LDMOS device;

Step 3: applying a photoresist to define an implantation region of a body doped region by means of the photoresist, performing etching to open an implantation window of the body doped region, and performing ion implantation of the body doped region to form the body doped region of the switching LDMOS device;

Step 4: performing ion implantation in a well to form an LDD region of the switching LDMOS device;

Step 5: depositing an oxide layer or a nitride layer, and then performing etching to form gate sidewalls at both sides of the gate structure of the switching LDMOS device; and Step 6: performing ion implantation to form a heavily doped region, so as to produce a source region and a drain region of the switching LDMOS device.

In an embodiment, in Step 3, formation of the body doped region is formation of a first body doped region of a second conductivity type; or a first body doped region of the second conductivity type and a second body doped region of a first conductivity type both are formed in two successive steps; the ion implantation of the first or second body doped region is self-aligned implantation under the definition of the photoresist, and implantation energy can be adjusted according to requirements of a breakdown voltage, without a need to consider whether a hole is punched through the polysilicon layer, so as to achieve a larger implantation junction depth; and a process of forming a channel region by means of the self-aligned implantation of the first or second body doped region is not shared by formation of other device structure, thereby increasing an implantation dose to increase an impurity concentration of the surface of the channel region and reducing the device size.

In an embodiment, the first conductivity type is a P type and the second conductivity type is an N type; or the first conductivity type is an N type and the second conductivity type is a P type.

In the switching LDMOS device of the present disclosure, the drain region is or both the drain region and the source region are placed in the body doped region, and the body doped region is defined by means of the photoresist and then is subject to targeted ion implantation. The formation of the channel region using the self-aligned ion implantation with the photoresist can be free of a limitation from other process or an effect of other structure, thereby achieving the objective of increasing the ion implantation energy and ion implantation dose, which is difficult to be implemented in conventional processes. Higher ion implantation energy can increase the junction depth, thereby making full use of the longitudinal depth of the LDD region, optimizing an electric field distribution at a drain end, and increasing the breakdown voltage BV of the device. A higher ion implantation dose can increase the surface concentration of the channel region, so the channel length Lch is reduced in the case where the breakdown voltage BV is ensured to satisfy design requirements, thereby achieving the objective of reducing the device size.

DETAILED DESCRIPTION OF EMBODIMENTS OF THE INVENTION

Regarding switching LDMOS devices, N LDMOS devices are primarily used in practical applications, and therefore, an N LDMOS device is used as an example for explanation in the embodiments of the present disclosure, that is, a first conductivity type is defined as a P type and a second conductivity type is defined as an N type. A P LDMOS device can be produced by inverting the related conductivity types.

Figure 8:
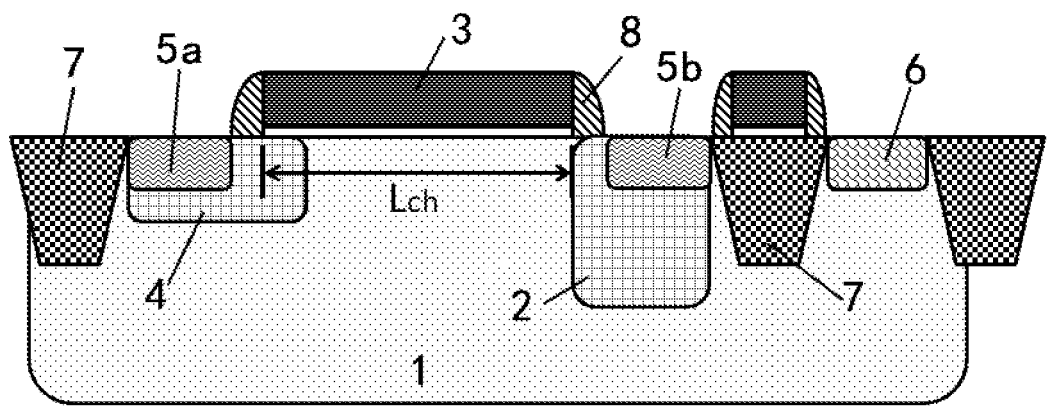

Referring to FIG. 8, which is a switching LDMOS device of the present disclosure, in Embodiment 1 of the switching LDMOS device provided by the present disclosure: the LDMOS device is formed in a first well of a P type in a semiconductor substrate, that is, a P well 1. The P well 1 includes an LDD region 4 of the switching LDMOS device and a first body doped region 2 of a N type. A gate structure of the switching LDMOS device is formed on the surface of the substrate between the LDD region and the body doped region 2 of the N type.

The gate structure includes a gate dielectric layer covering the substrate surface and a polysilicon gate 3 covering the gate dielectric layer. Gate sidewalls 8 are further provided at both sides of the gate structure.

An N type first heavily doped region 5a is provided in the LDD region 4, one side of the first heavily doped region 5a is in contact with the edge of the gate sidewall 8, and the N type first heavily doped region 5a serves as a source region of the switching LDMOS device.

An N type second heavily doped region 5b is provided in the first body doped region 2, one side of the second heavily doped region 5b is in contact with the edge of the gate sidewall 8, and the second heavily doped region 5b serves as a drain region of the switching LDMOS device.

A channel of the switching LDMOS device is formed in a surface layer of the semiconductor substrate between the LDD region and the body doped region and below the gate structure, the length of the channel is Lch, and when a voltage applied to the gate exceeds a threshold voltage of the LDMOS device, the channel is inverted to achieve conduction between the source region 5a and the drain region 5b.

One side of the LDD region 4 and one side of the body doped region 2 which are away from the gate structure both are provided with a field oxide 7 (or STI), and one side of the field oxide 7 is in contact with the first heavily doped region 5a in the LDD region 4 or the second heavily doped region 5b in the first body doped region 2.

In the first well 1, a P type third heavily doped region 6 is further provided at an outer side of the field oxide or STI of the first body doped region and away from the gate structure, and the third heavily doped region 6 forms a leading-out region to lead the first well 1 out of an electrode.

Still referring to FIG. 8, a second gate structure is further provided on the field oxide 7, for example, the field oxide between the second heavily doped region 5b and the third heavily doped region 6. The second gate structure and the gate structure of the switching LDMOS device are synchronously formed by means of etching, and the second gate structure is used as a mask for self-aligned implantation of the first heavily doped region and the second heavily doped region and has no electrical property, or, the second gate structure is used as a mask for self-aligned implantation of the first heavily doped region or the second heavily doped region and has no electrical property. After the self-aligned implantation is completed, the second gate structure can be selectively removed or retained.

Figure 14:
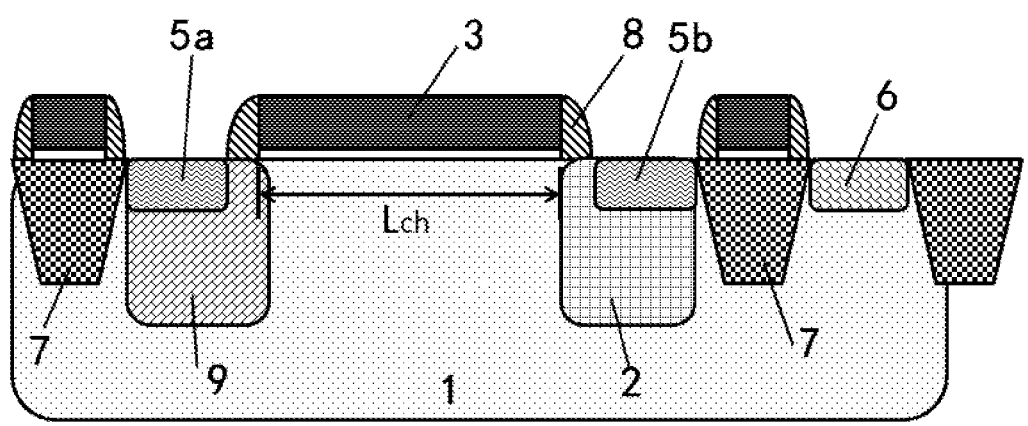
Figure 15:
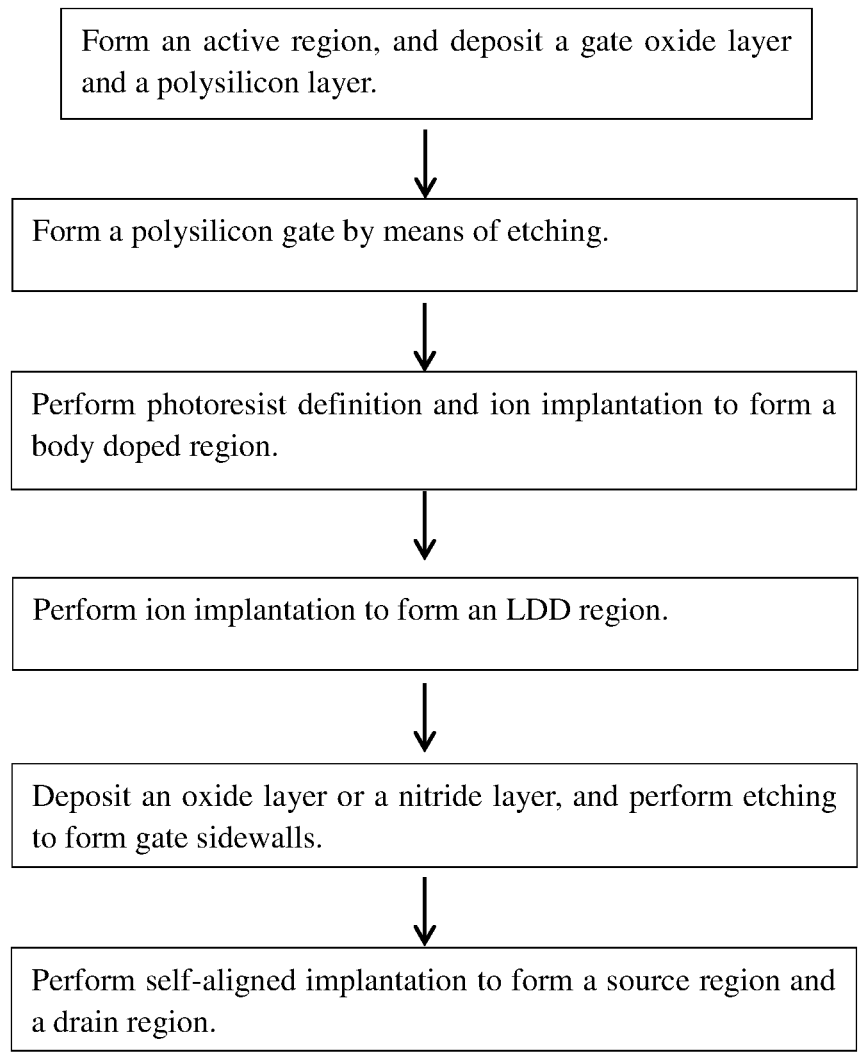
FIG. 15 is a flow chart of a manufacturing process of a switching LDMOS device according to the present disclosure.

Referring to Embodiment 2 shown by FIG. 14, which is another switching LDMOS device of the present disclosure, the switching LDMOS device is formed in a P type first well 1 in a semiconductor substrate.

The first well 1 includes an N type first body doped region 2 and a P type second body doped region 9. A gate structure of the switching LDMOS device is formed on the surface of the substrate between the first body doped region 2 and the second body doped region 9.

The gate structure includes a gate dielectric layer covering the substrate surface and a polysilicon gate 3 covering the gate dielectric layer. Gate sidewalls 8 are further provided at both sides of the gate structure.

An N type first heavily doped region 5a is provided in the second body doped region 9, one side of the first heavily doped region 5a is in contact with the edge of the gate sidewall 8, and the first heavily doped region 5a serves as a source region of the switching LDMOS device.

An N type second heavily doped region 5b is provided in the first body doped region 1, one side of the second heavily doped region 5b is in contact with the edge of the gate sidewall 8, and the second heavily doped region 5b serves as a drain region of the switching LDMOS device.

A channel of the switching LDMOS device is formed in a surface layer of the semiconductor substrate between the second body doped region 9 and the first body doped region 1 and below the gate structure, and when a voltage applied to the gate exceeds a threshold voltage of the LDMOS device, the channel is inverted to achieve conduction between the source region and the drain region.

One side of the second body doped region 9 and one side of the first body doped region 2 which are away from the gate structure both are provided with a field oxide 7, and one side of the field oxide 7 is in contact with the first heavily doped region in the second body doped region or the second heavily doped region in the first body doped region.

In the first well 1, a P type third heavily doped region 6 is further provided at an outer side of the field oxide 7 which away from the gate structure of the first body doped region 2, and the third heavily doped region 6 forms a leading-out region to lead the first well 1 out of an electrode.

Similar to Embodiment 1, a second gate structure is further provided on the field oxide. The second gate structure and the gate structure of the switching LDMOS device are synchronously formed by means of etching, and the second gate structure is used as a mask for self-aligned implantation of the first heavily doped region and the second heavily doped region, or, the second gate structure is used as a mask for self-aligned implantation of the first heavily doped region or the second heavily doped region. After the self-aligned implantation is completed, the second gate structure can be selectively removed or retained.

In Embodiment 2, the P type body region 9 is also formed by means of ion implantation at the source end. Therefore, the entire device is provided with a body region at the peripheries of the source region and the drain region, respectively. In the two embodiments described above, the first body doped region 2 and the second body doped region 9 are both formed by means of self-aligned implantation.

Figure 1:
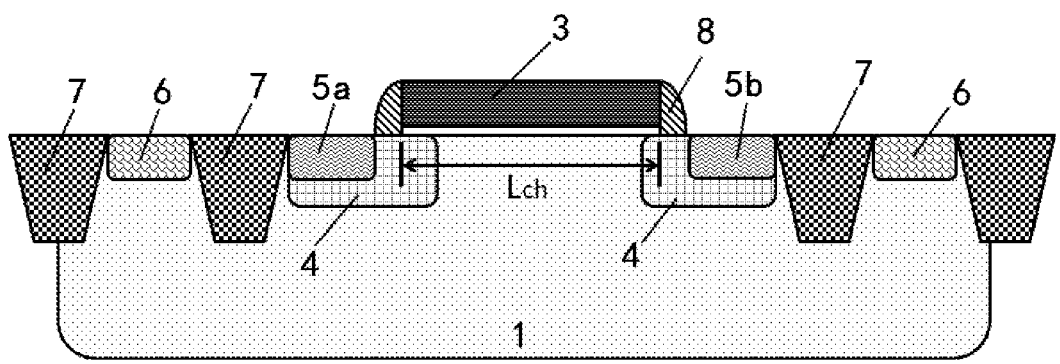
FIG. 1 is a structural schematic diagram of an existing switching LDMOS device.
Figure 2:
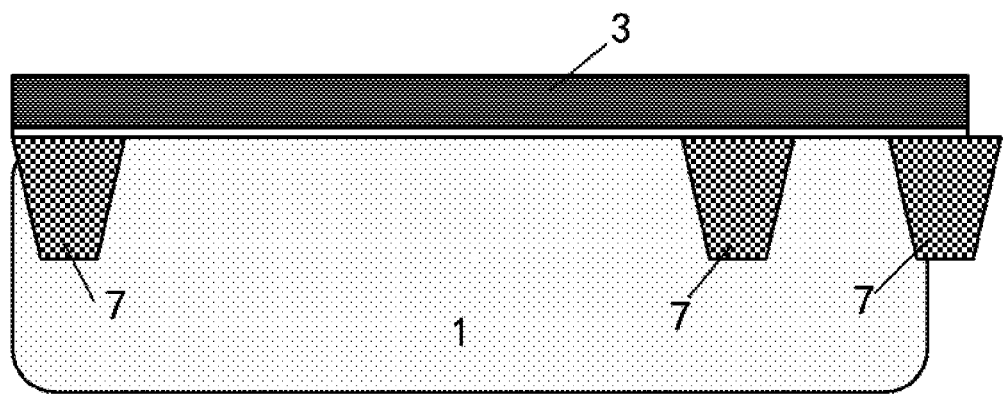
FIGS. 2-8 are diagrams of manufacturing process steps of a switching LDMOS device according to Embodiment 1 of the present disclosure.

Referring to FIGS. 2-8, regarding the structure of Embodiment 1, a method for manufacturing a switching LDMOS device of the present disclosure includes the following process steps:

Step 1: Referring to FIG. 2, a semiconductor substrate 1 is provided, wherein an active region is formed on the semiconductor substrate, the active region being used to form the switching LDMOS device; ion implantation is performed in the active region to produce a well region of the switching LDMOS device; form field oxide 7, and an oxide layer is deposited on the surface of the semiconductor substrate, and then a polysilicon layer 3 is deposited on the oxide layer.

Figure 3:
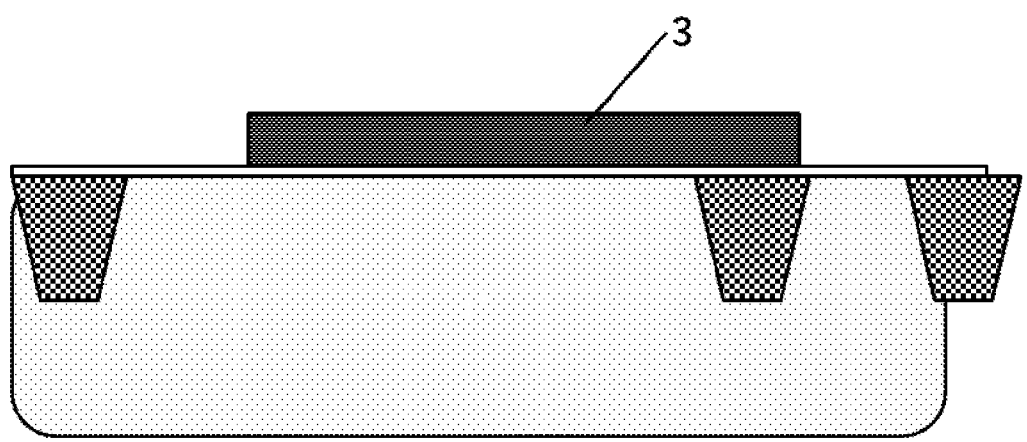

Step 2: Referring to FIG. 3, the polysilicon layer 3 and the oxide layer are etched by means of photoresist definition, to form a gate structure of the switching LDMOS device, wherein the oxide layer serves as a gate dielectric layer, and the polysilicon layer 3 is etching-molded to preliminarily form a polysilicon gate of the switching LDMOS device.

Figure 4:
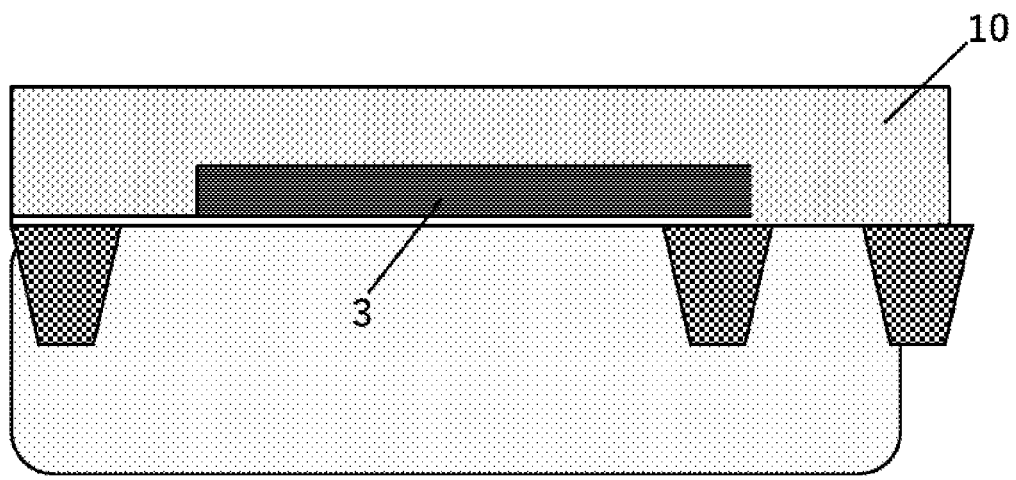
Figure 5:
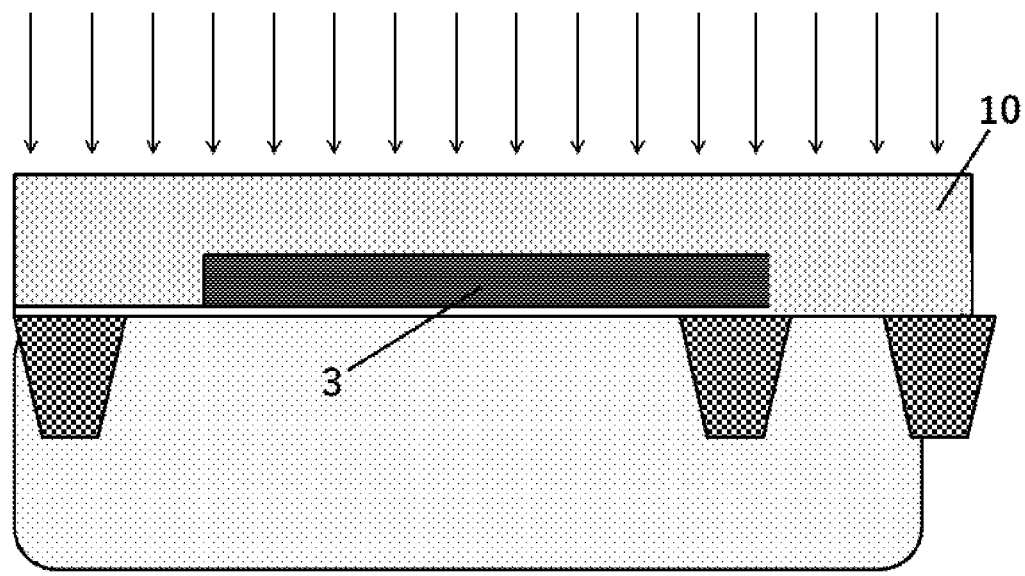
Figure 6:
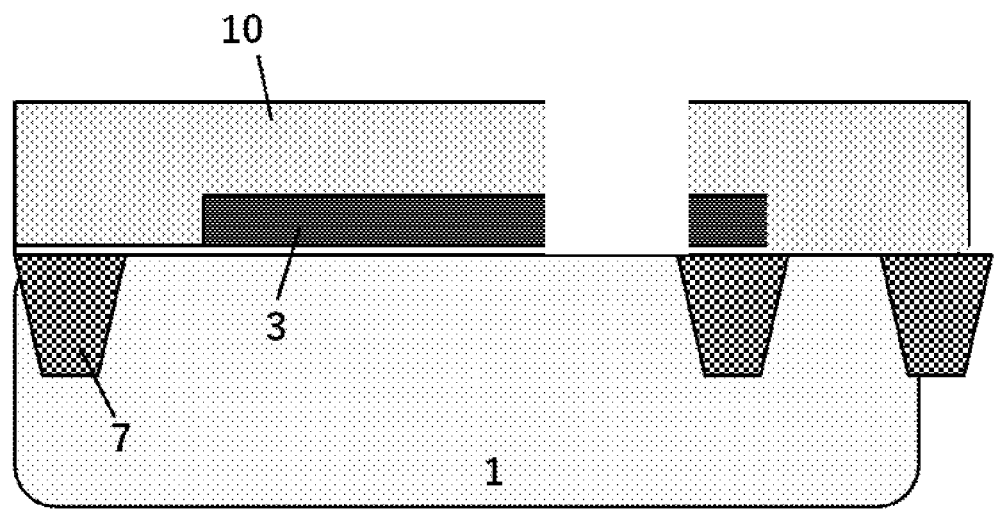
Figure 7:
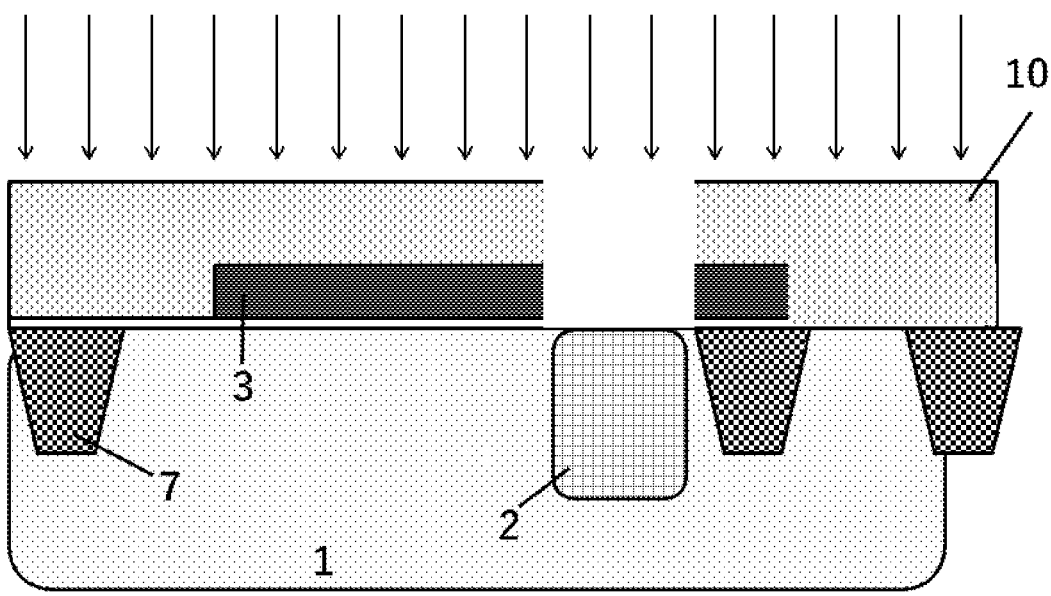

Step 3: A photoresist is applied to define an implantation region of a body doped region by means of the photoresist, etching is performed to open an implantation window of the body doped region, and ion implantation of the body doped region is performed to form the body doped region of the switching LDMOS device. In actual process applications or design scenarios, the structure of Embodiment 1 and the structure of Embodiment 2 may exist separately or coexist. In Embodiment 1, the two structures coexist. During P well implantation of the structure of Embodiment 2, since the structure of Embodiment 1 is not subject to P well implantation, P type implantation occurs for the first time in the structure of Embodiment 1 as shown in FIGS. 4 and 5, but no window is opened by means of the photoresist. Referring to FIGS. 6 and 7, during implantation of the N type body region, the implantation window of the N type body region is opened by means of the photoresist, and the ion implantation is performed to form the N type body region 2.

Step 4: Ion implantation is performed in a well 1 to form an LDD region 4 of the switching LDMOS device. This is an optional step, and a determination as to whether LDD implantation is to be performed can be performed as needed.

Step 5: An oxide layer or a nitride layer is deposited, and then etching is performed to form gate sidewalls 8 at both sides of the gate structure of the switching LDMOS device.

Step 6: Ion implantation is performed to form a heavily doped region, so as to produce a source region 5a and a drain region 5b of the switching LDMOS device, thereby completing production of the device, finally forming the device as shown in FIG. 8.

Referring to FIGS. 2, 9-14, regarding the structure of Embodiment 2, a method for manufacturing a switching LDMOS device of the present disclosure includes the following process steps:

Step 1: Referring to FIG. 2, a semiconductor substrate is provided, wherein an active region is formed on the semiconductor substrate, the active region being used to form the switching LDMOS device; ion implantation is performed in the active region to produce a well region of the switching LDMOS device; a field oxide is formed; and an oxide layer is deposited on the surface of the semiconductor substrate, and then a polysilicon layer is deposited on the oxide layer.

Figure 9:
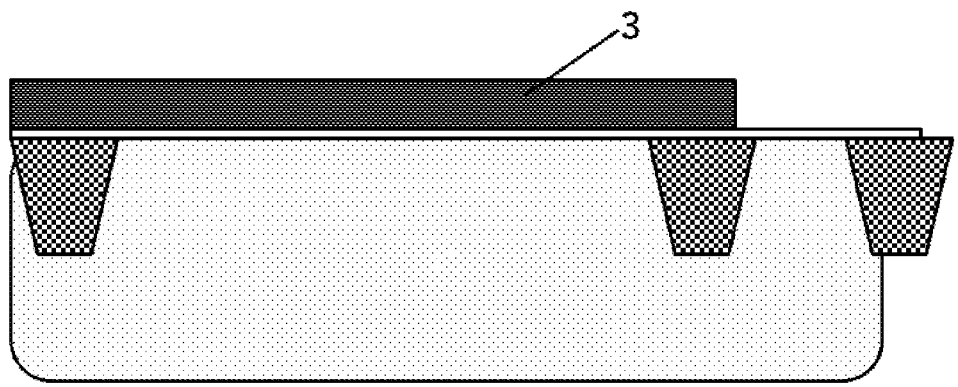
FIGS. 9-14 are diagrams of manufacturing process steps of a switching LDMOS device according to Embodiment 2 of the present disclosure.

Step 2: Referring to FIG. 9, the polysilicon layer 3 and the oxide layer are etched by means of photoresist definition, to form a gate structure of the switching LDMOS device, wherein the oxide layer serves as a gate dielectric layer, and the polysilicon layer is etching-molded to preliminarily form a polysilicon gate of the switching LDMOS device.

Figure 10:
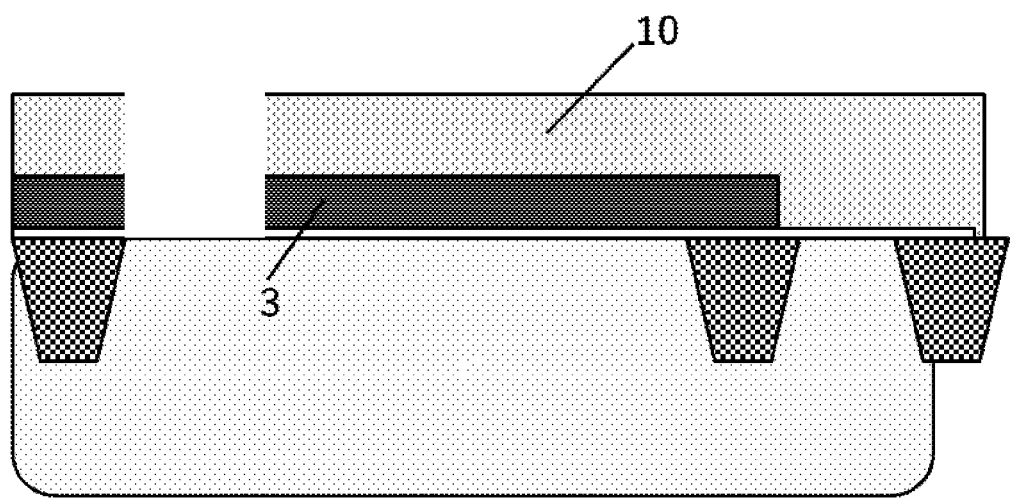
Figure 11:
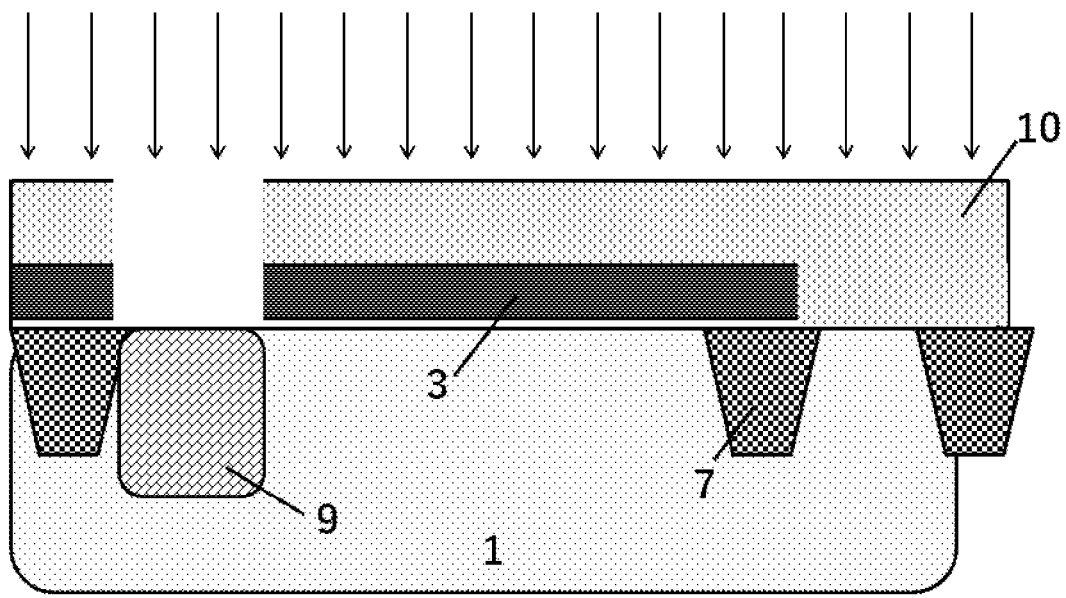
Figure 12:
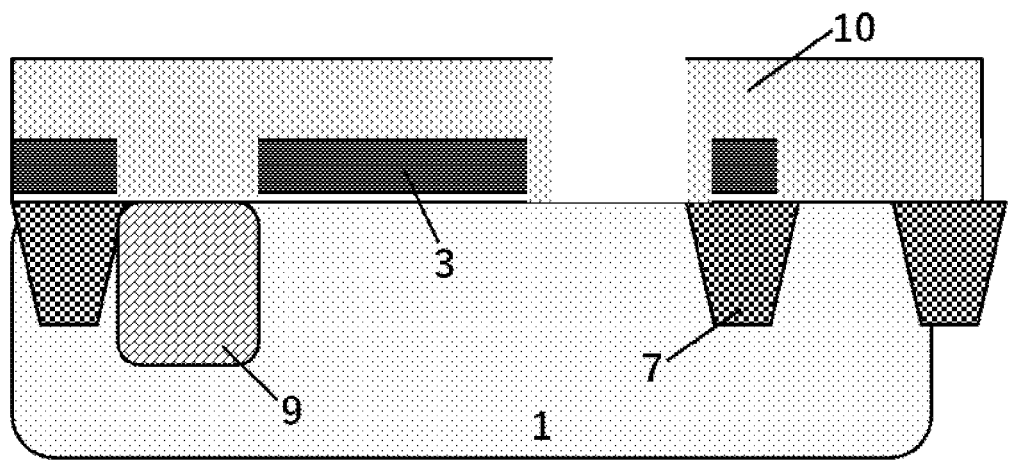
Figure 13:
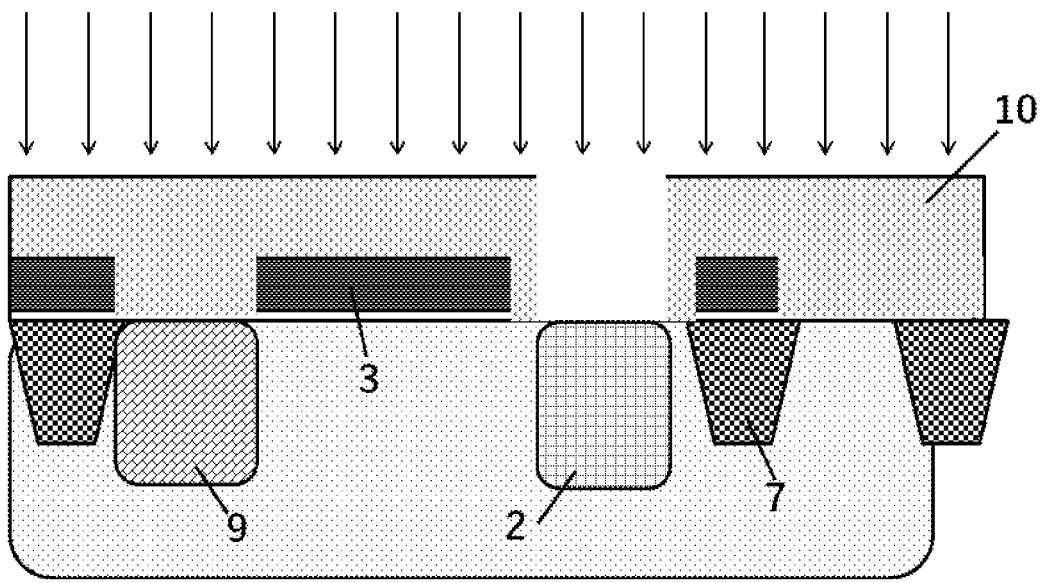

Step 3: A photoresist is applied to define an implantation region of a body doped region by means of the photoresist, etching is performed to open an implantation window of the body doped region, and ion implantation of the body doped region is performed to form the body doped region of the switching LDMOS device. Referring to FIGS. 10-13, in this embodiment, ion implantation of the P type body region 9 and the N type body region 2 is performed. First, the photoresist is used for definition, and the ion implantation window of the P type body region is opened by means of the photoresist. Referring to FIG. 10, an ion implantation process of the P type body region 9 is performed; then an ion implantation window of the N type body region 2 is defined by means of the photoresist 10, referring to FIG. 12, an ion implantation process of the N type body region is performed, to form the N type body region 2.

The ion implantation processes of the P-type body region and the N type body region described in the present disclosure both are performed under the cover of the photoresist. Therefore, the ion implantation energy can be increased as needed to increase an implantation junction depth, without a need to consider the case where excessively high ion implantation energy punches a hole through the polysilicon layer; and an ion concentration on the surface of a channel region can be increased by adjusting an ion implantation dose, thereby reducing a square resistance Rsp, reducing the device size by reducing the channel length Lch in the case where a desired breakdown voltage performance is achieved, improving the integration level, and reducing the cost.

Step 4: Ion implantation is performed in a well 1 to form an LDD region 4 of the switching LDMOS device. This is an optional step, and a determination as to whether LDD implantation is to be performed can be performed as needed.

Step 5: An oxide layer or a nitride layer is deposited, and then etching is performed to form gate sidewalls 8 at both sides of the gate structure of the switching LDMOS device.

Step 6: Ion implantation is performed to form a heavily doped region, so as to produce a source region 5a and a drain region 5b of the switching LDMOS device, thereby completing production of the device, finally forming the device as shown in FIG. 14.

The above embodiments are merely some embodiments of the present disclosure and are not intended to limit the present disclosure. For those skilled in the art, the present disclosure may have various modifications and changes.

Any modification, equivalent replacement, improvement, etc. performed within the spirit and principle of the present disclosure shall fall within the protection scope of the present disclosure.

EXPLANATIONS FOR REFERENCE NUMERALS OF THE DRAWINGS 1. first well;
2. first body doped region (Nbody);
3. polysilicon gate;
4. LDD region;
5a. first heavily doped region;
5b. second heavily doped region;
6. third heavily doped region;
7. field oxide;
8. gate sidewall;
9. second body doped region (Pbody); and
10. photoresist.

What is claimed is:

1. A switching LDMOS device comprising:
    a first conductivity type formed in a first well in a semiconductor substrate, wherein the first well comprises an LDD region and a body doped region of a second conductivity type, wherein the LDD region and the body doped region are laterally-spaced with the semiconductor substrate disposed therebetween, and a depth of the body doped region in the semiconductor substrate is greater than a depth of the LDD region in the semiconductor substrate;
    a gate structure formed on a surface of the substrate disposed between the LDD region and the body doped region of the second conductivity type, wherein the gate structure comprises a gate dielectric layer having a substantially uniform thickness covering the substrate surface, a polysilicon gate covering the gate dielectric layer, and gate sidewalls formed at opposing sides of the gate structure;
    a first heavily doped region of the second conductivity type provided in the LDD region, wherein one side of the first heavily doped region is in contact with an edge of one of the gate sidewalls, and the first heavily doped region serves as a source region;
    a second heavily doped region of the second conductivity type provided in the body doped region, wherein one side of the second heavily doped region is in contact with an edge of the other one of the gate sidewalls, and the second heavily doped region serves as a drain region;
    a channel formed in a surface layer of the semiconductor substrate disposed between the LDD region and the body doped region and below the gate structure, and wherein when a voltage applied to the gate exceeds a threshold voltage of the switching LDMOS device, the channel is inverted to achieve conduction between the source region and the drain region; and
    a field oxide or STI provided at one side of the LDD region and at one side of the body doped region which are away from the gate structure, and wherein one side of the field oxide or STI is in contact with the first heavily doped region in the LDD region or the second heavily doped region in the first body doped region.

2. The switching LDMOS device according to claim 1, further comprising:
    a third heavily doped region of the first conductivity type formed in the first well provided at an outer side of the field oxide or STI adjacent to the first body doped region, wherein the third heavily doped region forms a leading-out region to lead the first well out of an electrode.

3. The switching LDMOS device according to claim 1, further comprising:
    a second gate structure provided on the field oxide or STI adjacent to the first body doped region, wherein the second gate structure and the gate structure are synchronously formed by means of etching, the second gate structure is used as a mask for self-aligned implantation of the first heavily doped region and/or the second heavily doped region, and after the self-aligned implantation is completed, the second gate structure can be selectively removed or retained.

4. The switching LDMOS device according to claim 1, wherein the first body doped region of the second conductivity type is formed by means of self-aligned implantation.

5. The switching LDMOS device according to claim 1, wherein the first conductivity type is a P type and the second conductivity type is an N type; or the first conductivity type is an N type and the second conductivity type is a P type.

6. A switching LDMOS device comprising:
    a first conductivity type formed in a first well in a semiconductor substrate, wherein the first well comprises a first body doped region of a second conductivity type and a second body doped region of a first conductivity type, wherein the first body doped region and the second body doped region are laterally-spaced with the semiconductor substrate disposed therebetween, a depth of the first body doped region in the semiconductor substrate is substantially the same as a depth of the second body doped region in the semiconductor substrate and the depths of the first body doped region and the second body doped region extend substantially into the substrate;
    a gate structure formed on a surface of the substrate disposed between the first body doped region and the second body doped region, wherein the gate structure comprises a gate dielectric layer having a substantially uniform thickness covering the substrate surface, a polysilicon gate covering the gate dielectric layer, and gate sidewalls formed at opposing sides of the gate structure;
    a first heavily doped region of the second conductivity type provided in the second body doped region, wherein one side of the first heavily doped region is in contact with an edge of one of the gate sidewalls, and the first heavily doped region serves as a source region;
    a second heavily doped region of the second conductivity type provided in the first body doped region, wherein one side of the second heavily doped region is in contact with an edge of the other one of the gate sidewalls, and the second heavily doped region serves as a drain region;
    a channel formed in a surface layer of the semiconductor substrate disposed between the second body doped region and the first body doped region and below the gate structure, and wherein when a voltage applied to the gate exceeds a threshold voltage of the switching LDMOS device, the channel is inverted to achieve conduction between the source region and the drain region; and
    a field oxide or STI provided at one side of the second body doped region and at one side of the first body doped region which are away from the gate structure, and wherein one side of the field oxide or STI is in contact with the first heavily doped region in the second body doped region or the second heavily doped region in the first body doped region.

7. The switching LDMOS device according to claim 6, further comprising:
   a third heavily doped region of the first conductivity type formed in the first well provided at an outer side of the field oxide or STI adjacent to the first body doped region, wherein the third heavily doped region forms a leading-out region to lead the first well out of an electrode.

8. The switching LDMOS device according to claim 6, further comprising:
   a second gate structure provided on the field oxide or STI adjacent to the first body doped region, wherein the second gate structure and the gate structure are synchronously formed by means of etching, the second gate structure is used as a mask for self-aligned implantation of the first heavily doped region and the second heavily doped region, or, the second gate structure is used as a mask for self-aligned implantation of the first heavily doped region or the second heavily doped region, and after the self-aligned implantation is completed, the second gate structure can be selectively removed or retained.

9. The switching LDMOS device according to claim 6, wherein the first body doped region and the second body doped region are formed by means of self-aligned implantation.

* * * * *